US012696464B2

(12) United States Patent
Lin et al.

(10) Patent No.: US 12,696,464 B2
(45) Date of Patent: Jul. 28, 2026

(54) SEMICONDUCTOR DEVICE AND METHOD OF FORMING THE SAME

(71) Applicant: Taiwan Semiconductor Manufacturing Company, Ltd., Hsinchu (TW)

(72) Inventors: Ming-Hsun Lin, Hsinchu (TW); Yu Jiang, Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 394 days.

(21) Appl. No.: 18/407,441

(22) Filed: Jan. 9, 2024

(65) Prior Publication Data
US 2025/0227941 A1 Jul. 10, 2025

(51) Int. Cl.
| | |
|---|---|
| *H10D 1/66* | (2025.01) |
| *H10D 1/00* | (2025.01) |
| *H10D 64/01* | (2025.01) |
| *H10W 20/42* | (2026.01) |

(52) U.S. Cl.
CPC ............. *H10D 1/665* (2025.01); *H10D 1/047* (2025.01); *H10D 64/015* (2025.01); *H10D 64/021* (2025.01); *H10W 20/42* (2026.01)

(58) Field of Classification Search
CPC ...... H10D 1/665; H10D 1/047; H10D 64/021; H10D 64/015; H10W 20/42
See application file for complete search history.

(56) References Cited

U.S. PATENT DOCUMENTS

| | | | |
|---|---|---|---|
| 2023/0060558 A1* | 3/2023 | Chang | H10D 84/619 |
| 2023/0066352 A1* | 3/2023 | Liu | H10D 1/042 |
| 2024/0120369 A1* | 4/2024 | Xie | H10D 1/042 |

* cited by examiner

*Primary Examiner* — Richard A Booth
(74) *Attorney, Agent, or Firm* — JCIPRNET

(57) ABSTRACT

A semiconductor device includes a substrate and a deep trench capacitor structure. The deep trench capacitor structure includes a plurality of electrode layers and a plurality of dielectric layers alternately stacked, a contact via and at least one pair of spacers. The electrode layers and the dielectric layers form a mirror staircase portion over the substrate and a deep trench portion in the substrate. The contact via is electrically connected to a bottommost one of the electrode layers in the mirror staircase portion. The at least one pair of spacers is disposed on the mirror staircase portion and surrounds the contact via.

20 Claims, 16 Drawing Sheets

SEMICONDUCTOR DEVICE AND METHOD OF FORMING THE SAME

BACKGROUND

Deep trench capacitors (DTC) are used in semiconductor chips for many applications such as power supply stabilization.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
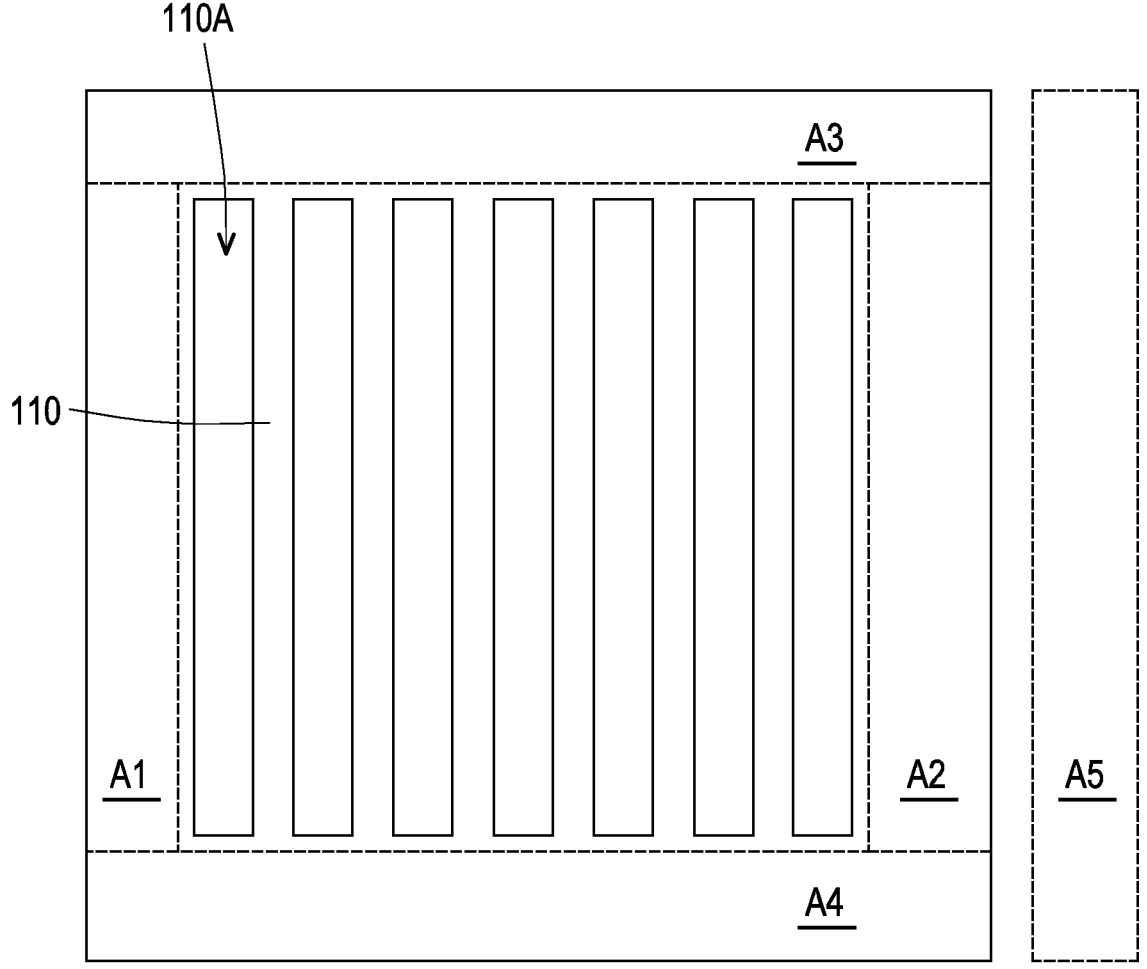
FIG. 1 illustrates a top view of a semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a top view of a semiconductor device according to some embodiments. FIG. 2A to FIG. 2M are schematic cross-sectional views illustrating a method of forming a semiconductor device according to some embodiments.

Figure 2A:
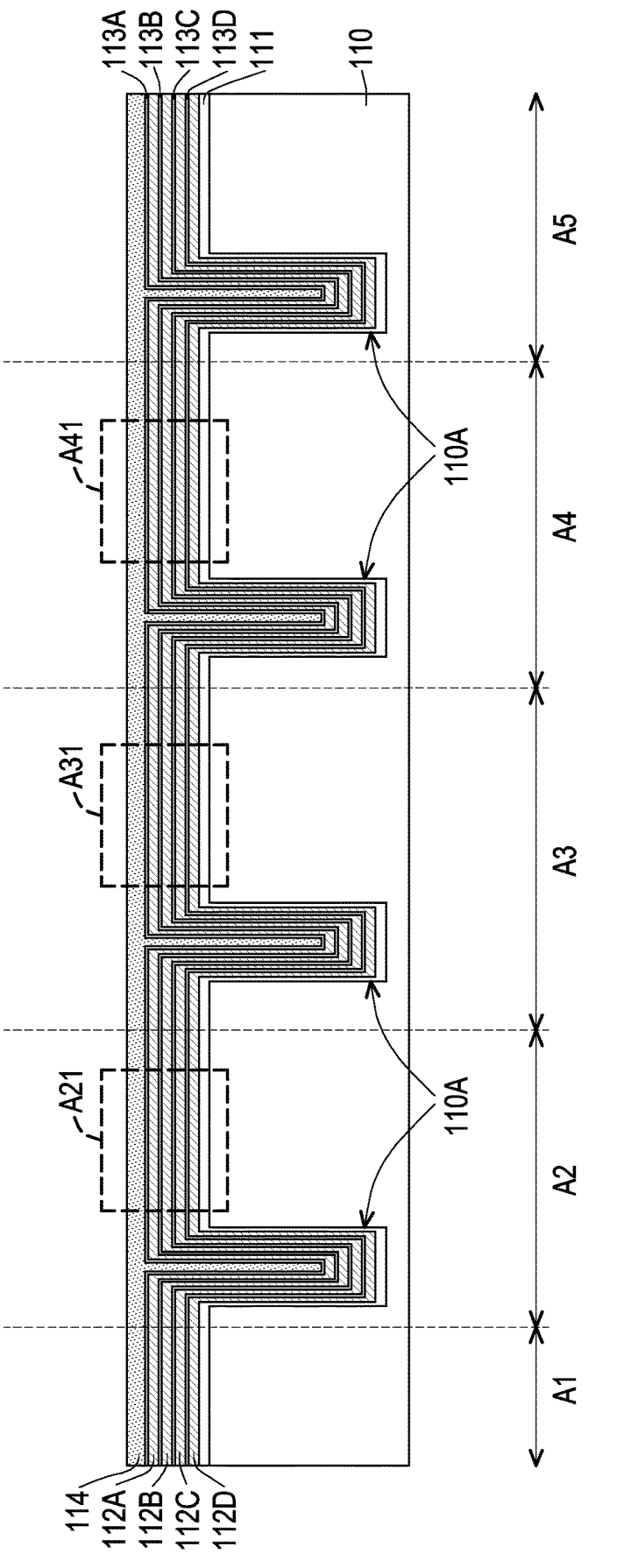
FIG. 2A to FIG. 2M are schematic cross-sectional views illustrating a method of forming a semiconductor device according to some embodiments.
Figure 2B:
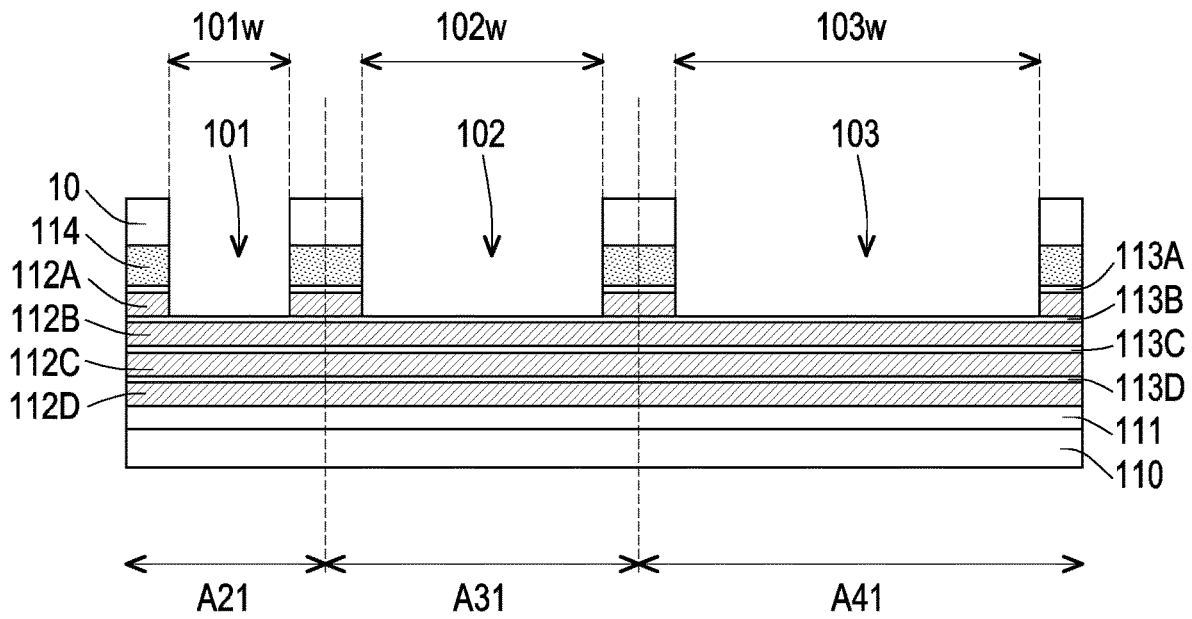
Figure 2C:
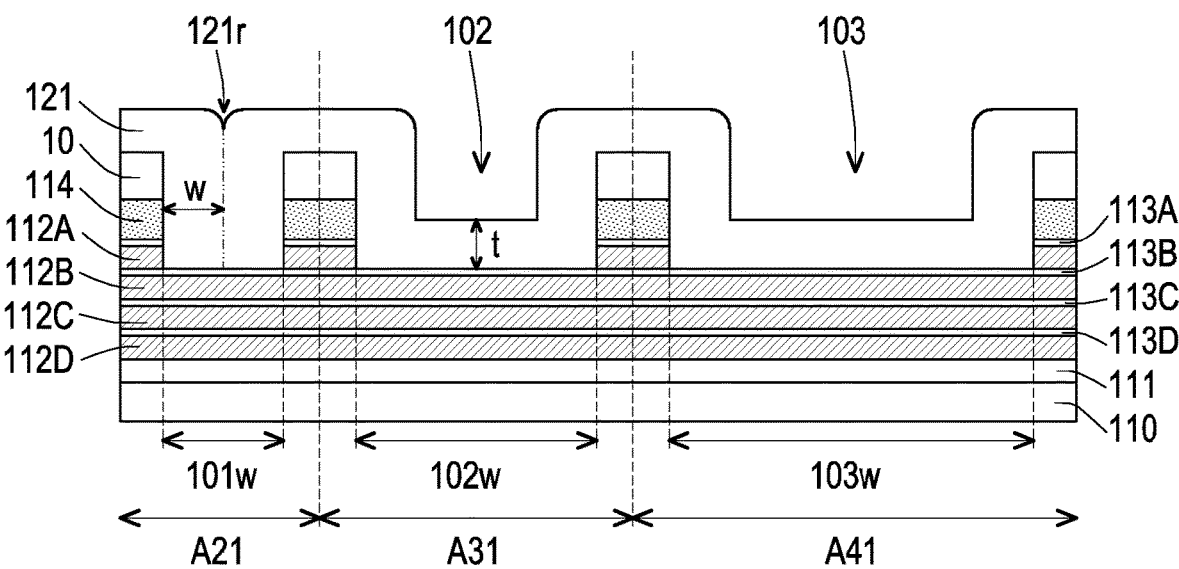
Figure 2D:
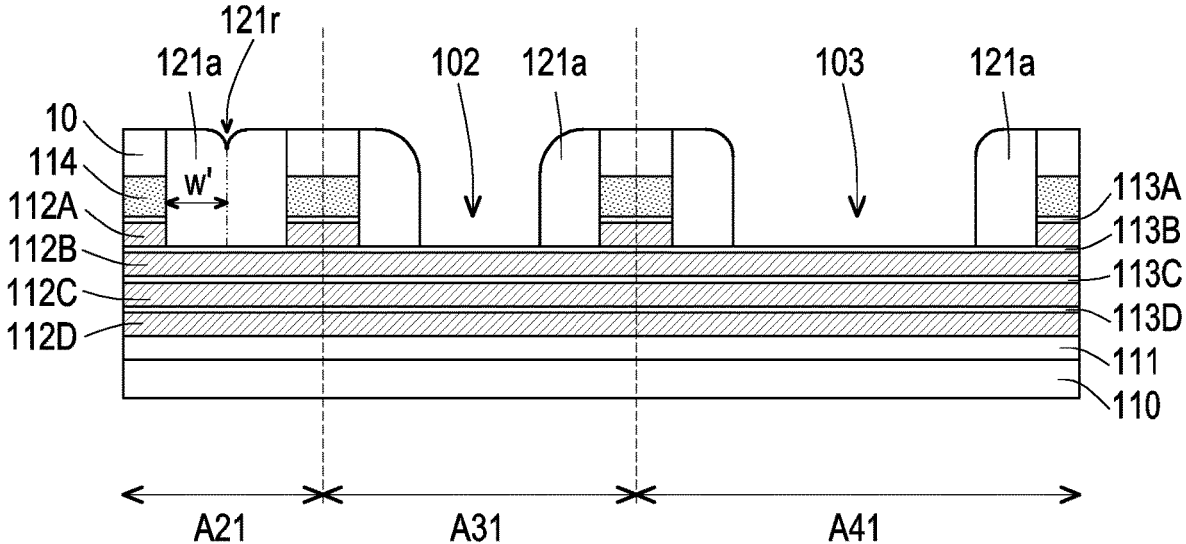
Figure 2E:
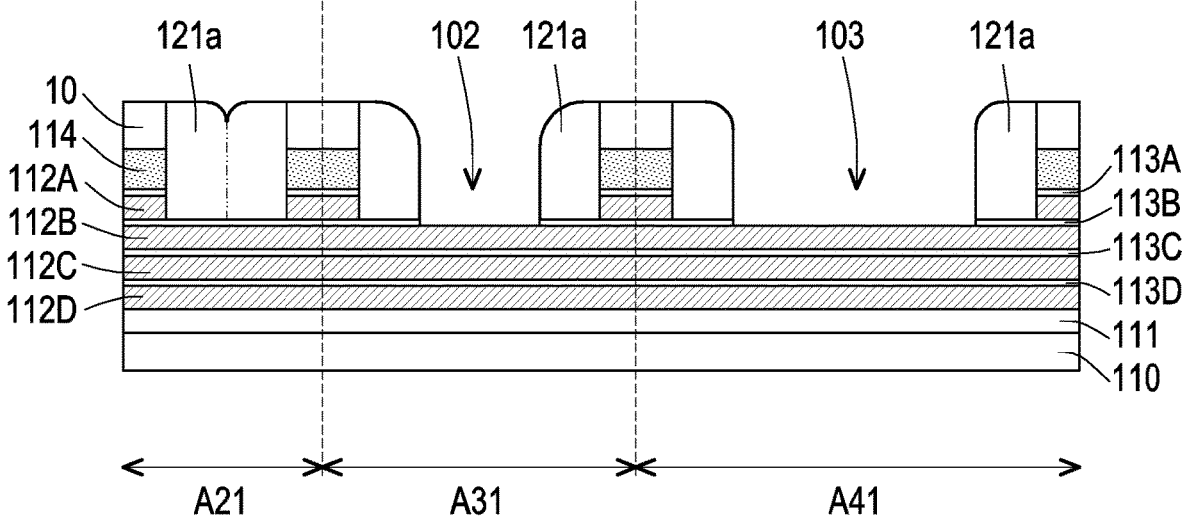
Figure 2F:
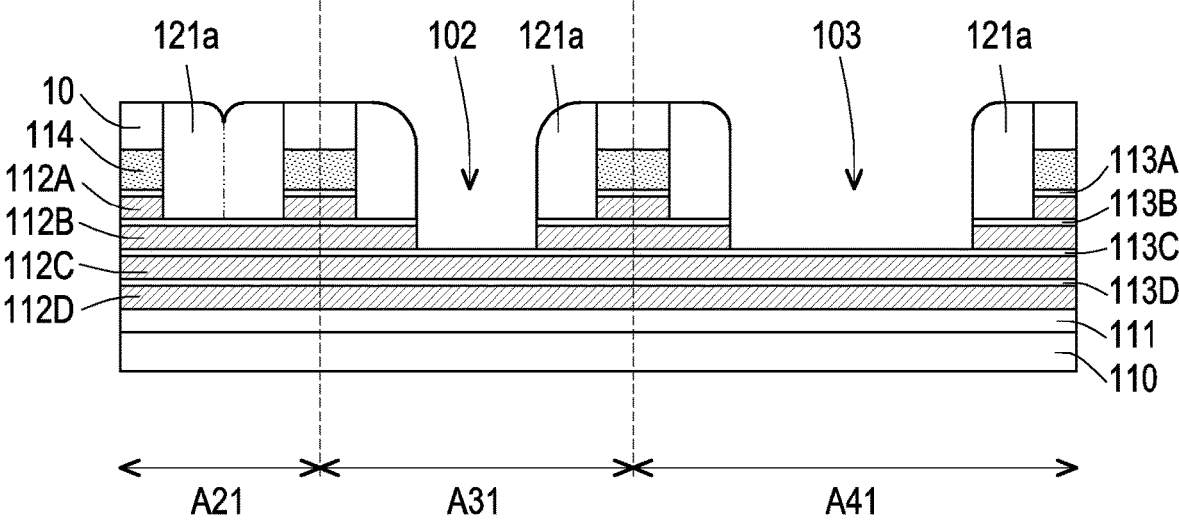
Figure 2G:
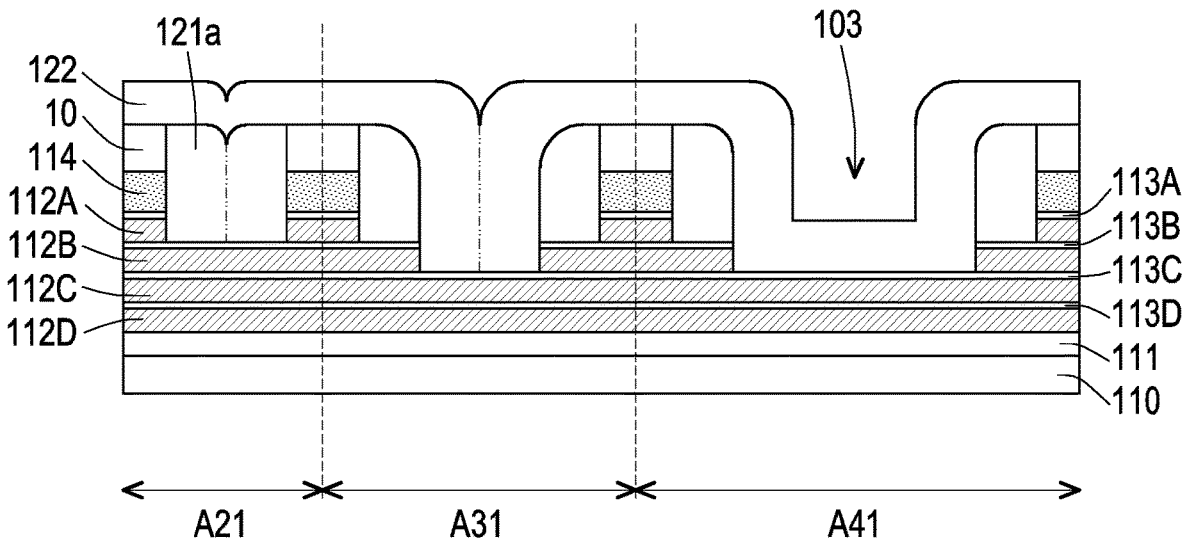
Figure 2H:
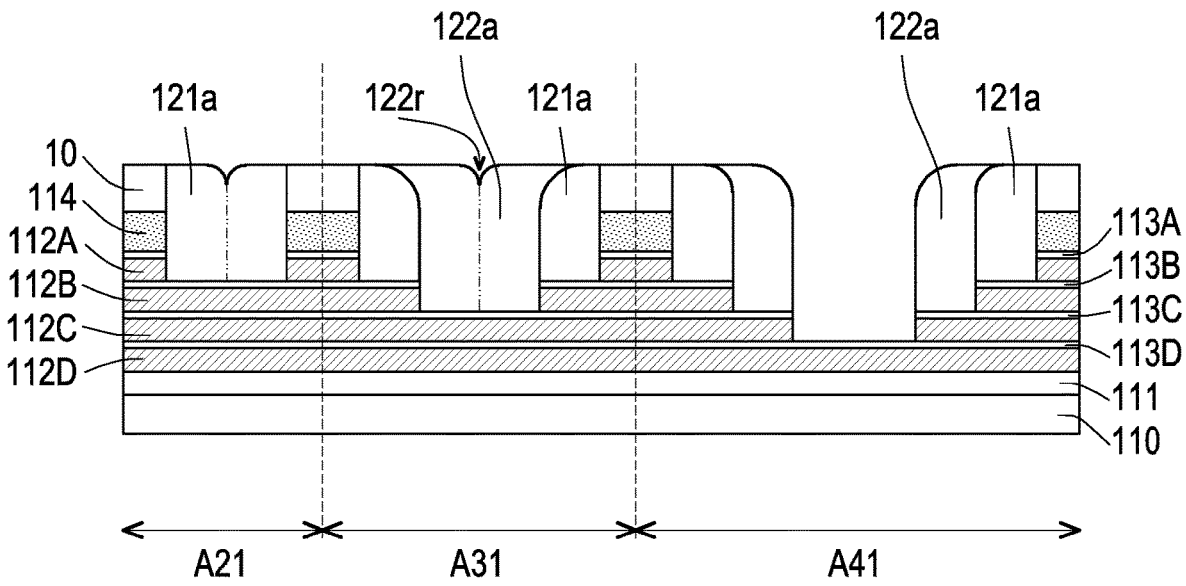
Figure 2I:
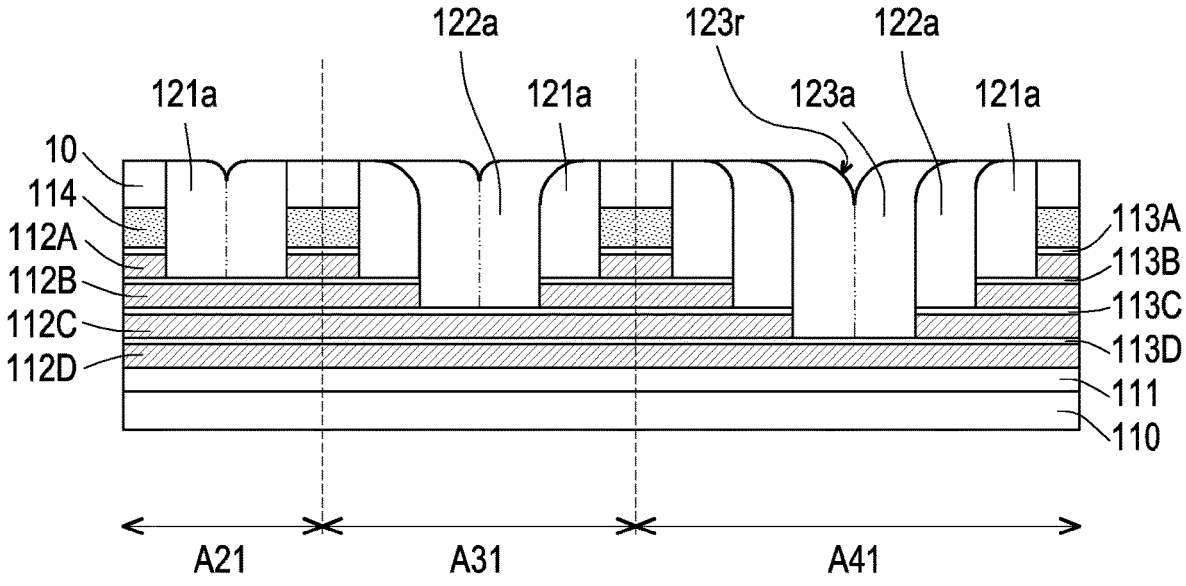
Figure 2J:
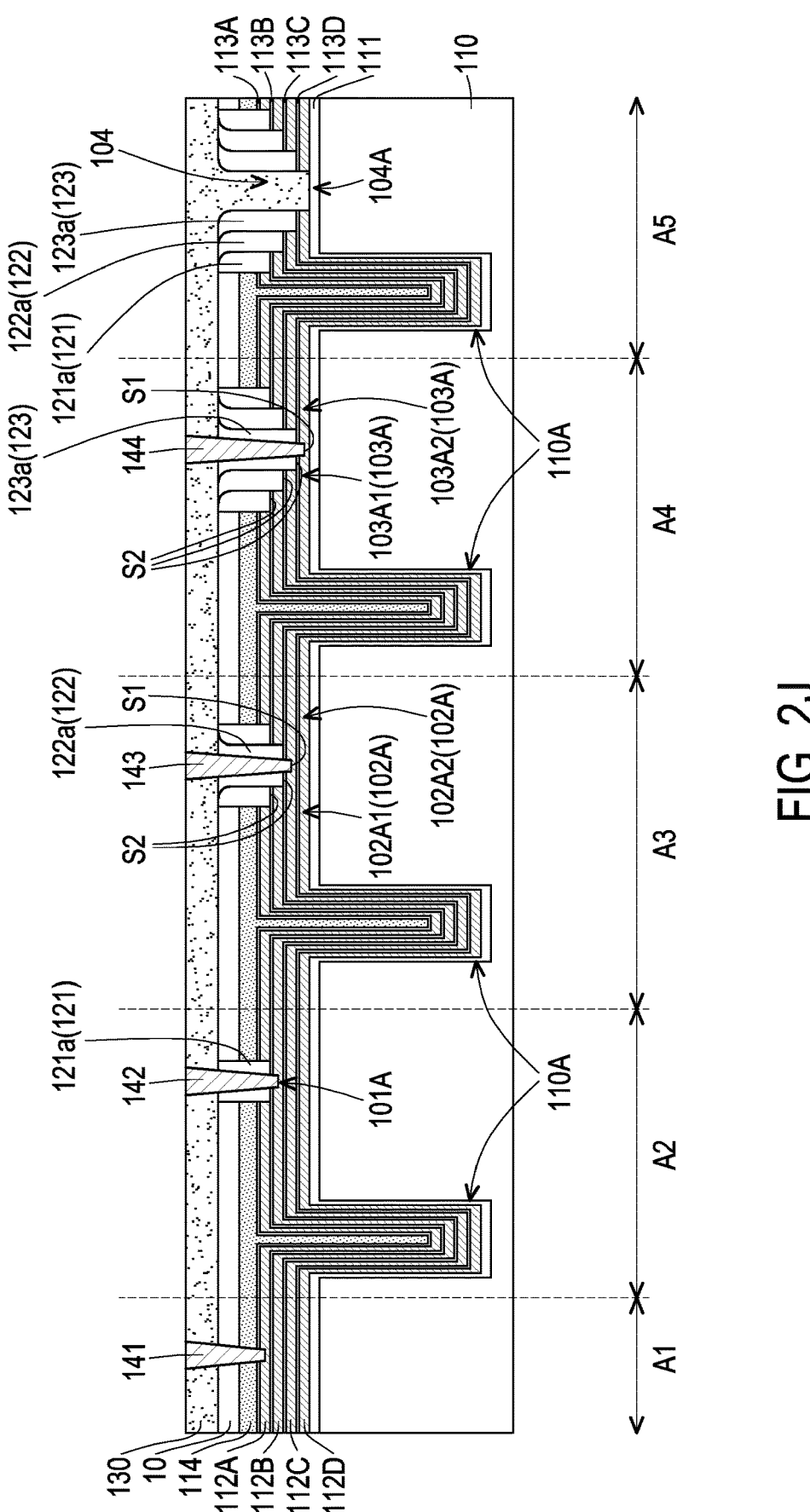
Figure 2K:
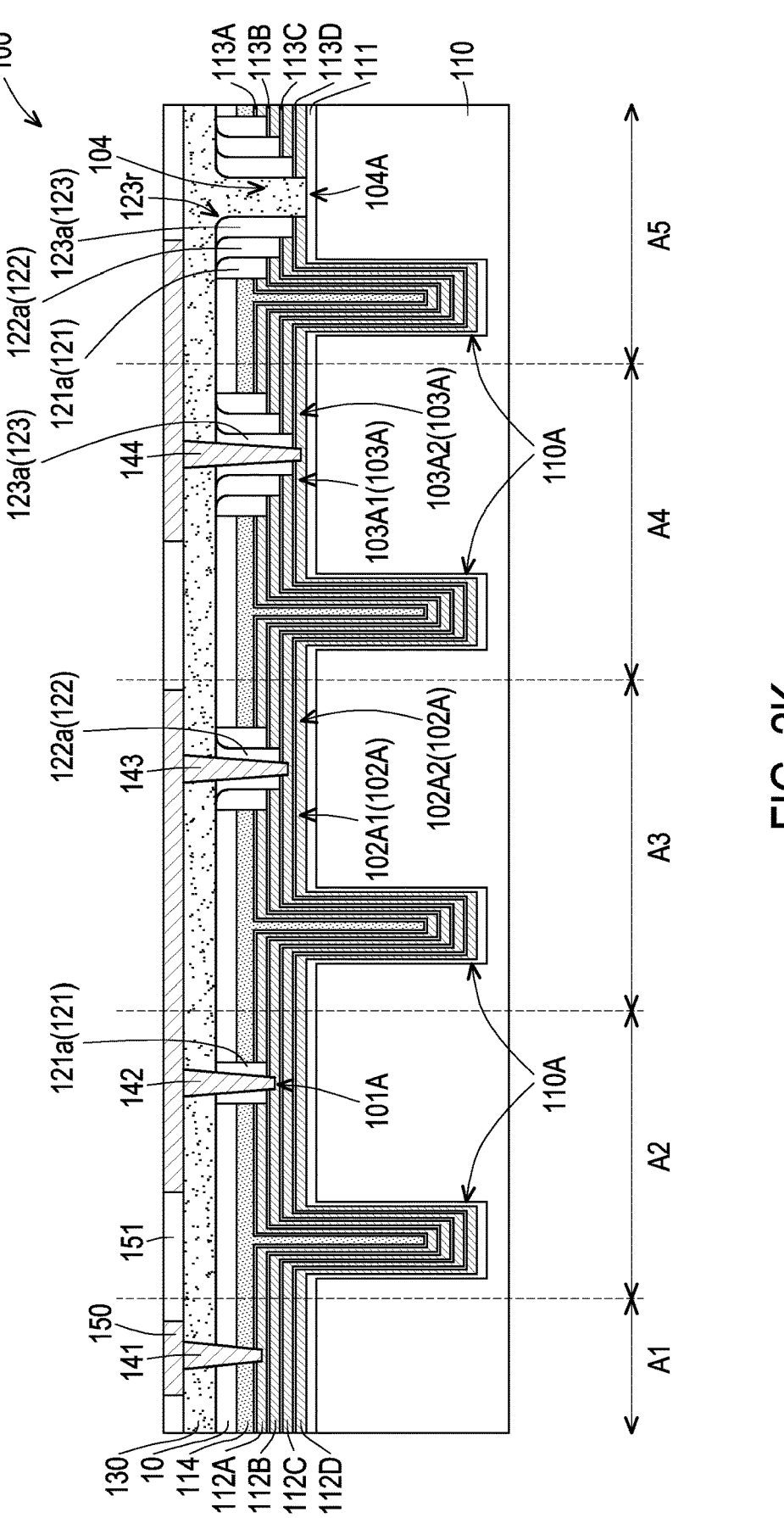

FIG. 2A, FIG. 2J, and FIG. 2K illustrate cross-sectional views of different areas (e.g., first to fifth areas A1, A2, A3, A4, and A5) in FIG. 1 and all of the cross-sectional views of different areas are illustrated in a same cross-section and are separated by dashed lines for illustration purpose. For clarity, FIG. 2B to FIG. 2I merely illustrate enlarged views of a portion of the second to fourth areas A2, A3, and A4 (referred to as regions A21, A31, and A41) in FIG. 2A, and all of the enlarged views of different regions are illustrated in a same cross-section and are separated by dashed lines for illustration purpose. It is noted that although the fifth area A5 is not illustrated in FIG. 2B to FIG. 2I, the fifth area A5 also undergoes the processes described in FIG. 2B to FIG. 2I as the first region A21, the second region A31, and the third region A41, to form the structure in the fifth area A5 as shown in FIG. 2J.

Referring to FIG. 1 and FIG. 2A, a substrate 110 is provided. In some embodiments, the substrate 110 is a bulk substrate, such as a silicon substrate, doped or undoped, or an active layer of a semiconductor-on-insulator (SOI) substrate. In some embodiments, the substrate 110 includes other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Then, a plurality of deep trenches 110A may be formed in the substrate 110. For example, as shown in FIG. 2A, the deep trenches 110A are extending downward from a top surface of the substrate 110 toward a backside surface of the substrate 110. In some embodiments, the deep trenches 110A are formed by forming a patterned etch mask layer (not shown) on the top surface of the substrate 110 and transferring the pattern in the patterned etch mask layer onto the substrate 110 through an anisotropic etch process. For example, a reactive ion etch process using a combination of gases including HBr, $NF_3$, $O_2$, and $SF_6$ is used to form the deep trenches 110A with a suitable depth. In some embodiments, the horizontal cross-sectional shape of the deep trench 110A has a shape of a circle, an ellipse, a rectangle, a rounded rectangle, an annulus having an inner periphery and an outer periphery of various shapes, or of any two-dimensional shape that defines an enclosed volume.

After that, a dielectric liner 111 may be formed on the substrate 110. For example, the dielectric liner 111 is formed on the top surface of the substrate 110 and sidewalls and bottom surfaces of the deep trenches 110A. The dielectric liner 111 may include silicon oxide, silicon nitride, silicon oxynitride, and/or a dielectric metal oxide. Other suitable dielectric liner materials within the contemplated scope of disclosure may also be used. In an illustrative example, the dielectric liner 111 includes a silicon oxide layer formed by thermal oxidation of exposed surfaces of the substrate 110 that includes silicon.

In some embodiments, after the dielectric liner 111 is formed, a plurality of electrode layers (112A, 112B, 112C, 112D) and a plurality of dielectric layers (113A, 113B, 113C, 113D) may be formed. The electrode layers (112A, 112B, 112C, 112D) and the dielectric layers (113A, 113B, 113C, 113D) may be alternately stacked and extended over the substrate 110 and the dielectric liner 111. In some embodiments, the electrode layers (112A, 112B, 112C, 112D) and the dielectric layers (113A, 113B, 113C, 113D) are extended into each of the deep trenches 110A.

In some embodiments, from top to down, the electrode layers (112A, 112B, 112C, 112D) may be referred to a first electrode layer 112A, a second electrode layer 112B, a third electrode layer 112C, and a fourth electrode layer 112D, while the dielectric layers (113A, 113B, 113C, 113D) may be referred to a first dielectric layer 113A, a second dielectric layer 113B, a third dielectric layer 113C, and a fourth dielectric layer 113D. It is noted that although four (4) electrode layers (112A, 112B, 112C, 112D) and four (4) dielectric layers (113A, 113B, 113C, 113D) are illustrated, there may be less or more layers of electrode layers and dielectric layers used to form staircase portions.

The electrode layers (112A, 112B, 112C, 112D) may include a metallic material, which include, and/or consist essentially of, a conductive metallic nitride, an elemental metal, or an intermetallic alloy. In some embodiments, the electrode layers (112A, 112B, 112C, 112D) includes, and/or consists essentially of, a conductive metallic nitride material, which may be a metallic diffusion barrier material. For example, the electrode layers (112A, 112B, 112C, 112D) include Ti, TiN, Cu, A1, or W. Other suitable materials within the contemplated scope of disclosure may also be used. In some embodiments, the electrode layers (112A, 112B, 112C, 112D) are formed by a conformal deposition process such as chemical vapor deposition (CVD) or atomic layer deposition (ALD).

The dielectric layers (113A, 113B, 113C, 113D) may include a dielectric material, which may be a dielectric metal oxide material having a dielectric constant greater than 7.9 (which is the dielectric constant of silicon nitride), i.e., a "high-k" dielectric metal oxide material, or may include silicon nitride. For example, the dielectric layers (113A, 113B, 113C, 113D) may include a dielectric metal oxide material such as aluminum oxide, hafnium oxide, zirconium oxide, tantalum oxide, lanthanum oxide, an alloy or a silicate thereof, and/or a layer stack thereof. In some embodiments, the dielectric layers (113A, 113B, 113C, 113D) include $Al_2O_3$, $HfO_2$, $ZrO_2$, $ZrSiO_4$, or $HfSiO_4$. Other suitable materials within the contemplated scope of disclosure may also be used. In some embodiments, the dielectric layers (113A, 113B, 113C, 113D) are formed by a conformal deposition process such as chemical vapor deposition (CVD) or atomic layer deposition (ALD).

In some embodiments, a dielectric layer 114 is formed over the electrode layers (112A, 112B, 112C, 112D) and the dielectric layers (113A, 113B, 113C, 113D) and fill the volumes of cavities that remain in the deep trenches 110A. In some embodiments, the dielectric layer 114 includes, and/or consists essentially of, undoped silicate glass or a doped silicate glass. In some embodiments, the dielectric layer 114 is formed by a conformal deposition process such as chemical vapor deposition (CVD) or atomic layer deposition (ALD).

Referring to FIG. 1 and FIG. 2A, in a deep trench capacitor structure, each of the electrode layers (112A, 112B, 112C, 112D) may be then electrically connected to the correspondingly contact via (not shown) for signal transmission. For example, a contact via electrically connected to the first electrode layer 112A is then formed in the first area A1, a contact via electrically connected to the second electrode layer 112B is then formed in the second area A2, a contact via electrically connected to the third electrode layer 112C is then formed in the third area A3, and a contact via electrically connected to the fourth electrode layer 112D is then formed in the fourth area A4.

Referring to FIG. 2B, portions of the first dielectric layer 113A of the dielectric layers (113A, 113B, 113C, 113D) and the first electrode layer 112A of the electrode layers (112A, 112B, 112C, 112D) are removed to form a first opening 101, a second opening 102, and a third opening 103. In some embodiments, the portions of the dielectric layer 114 are removed simultaneously. For example, a hard mask layer 10 is formed over the substrate 110 and includes a plurality of openings corresponding to the first to third openings 101, 102, and 103. Then, by using the hard mask layer 10 as a mask, the dielectric layer 114, the first dielectric layer 113A and the first electrode layer 112A may be partially removed to form the first to third openings 101, 102, and 103. As shown in FIG. 2B, after removal, sidewalls of the dielectric layer 114, the first dielectric layer 113A and the first electrode layer 112A and a top surface of the second dielectric layer 113B may be exposed by the first to third openings 101, 102, and 103.

In some embodiments, the first to third openings 101, 102, and 103 have different size. For example, a third width $103w$ of the third opening 103 is larger than a second width $102w$ of the second opening 102, and the second width $102w$ of the second opening 102 is larger than a first width $101w$ of the first opening 101. The first width $101w$, the second width $102w$ and the third width $103w$ may be determined by the number of the electrode layers 112 to be exposed. For example, three (3) layers of electrode layers 112B, 112C, 112D are illustrated to be exposed, the second width $102w$ is about twice of the first width $101w$, and the third width $103w$ is about triple of the first width $101w$.

Referring to FIG. 2C, a first spacer layer 121 may be formed to fill up the first opening 101 and partially fill the second opening 102 and the third opening 103. In some embodiments, the first spacer layer 121 is conformally formed over the first opening 101, the second opening 102 and the third opening 103 with a suitable thickness t (width w), such that portions of the first spacer layer 121 on opposite sidewalls of the first opening 101 merge together to fill up the first opening 101 having the smallest width. In some embodiments, a recess $121r$ is formed at where the portions of the first spacer layer 121 on the opposite sidewalls of the first opening 101 merge. The dimension of the first spacer layer 121 on bottom surfaces of the first to third openings 101, 102 and 103 may be referred to as a thickness while the dimension of the first spacer layer 121 on the sidewalls of the first to third openings 101, 102 and 103 may be referred to as a width w. The width w of the first spacer layer 121 on the sidewalls of the first to third openings 101, 102 and 103 is substantially the same as the thickness of the first spacer layer 121 on bottom surfaces of the first to third openings 101, 102 and 103, for example. In some embodiments, the width w of the first spacer layer 121 on the sidewall of the first opening 101 is larger than or equal to one-half of the width $101w$ of the first opening 101, and smaller than one-half of the width $102w$ of the second opening 102, so as to fill up the smallest opening (e.g., 101) without filling up other openings (e.g., 102, 103). The first spacer layer 121 may include SiN, $SiO_2$, or the like and may be formed by a deposition process or other suitable process.

Referring to FIG. 2D, by removing portions of the first spacer layer 121, pairs of first spacers $121a$ are respectively formed in the first opening 101, the second opening 102, and the third opening 103. The pair of first spacers $121a$ in the first opening 101 may be formed by removing portions of the first spacer layer 121 outside the first opening 101. The pairs of first spacers $121a$ in the second and third openings 102 and 103 may be formed by removing portions of the first spacer layer 121 outside the second opening 102 and the third opening 103 and portions of the first spacer layer 121 on the bottom surfaces of the second and third openings 102 and 103. The portions of the first spacer layer 121 may be removed simultaneously by a first etching process. In some embodiments, the first etching process is performed by using an etchant such as $SF_6$, $CF_4$, $CHF_3$, $CH_2F_2$, $C_4F_6$, a combination thereof or the like. The width of the spacer 121a may be 0.05 to 0.15 um, and a height of the spacer 121a may be 0.16 to 0.20 um, for example.

In some embodiments, as shown in FIG. 2D, after the formation of the first spacers 121a in the first opening 101, the recess 121r is remained at where the first spacers 121a contact. The recess 121r may be at a top surface of the pair of first spacers 121a and recessed towards the center of the first opening 101 in the vertical direction. In such embodiments, a top surface of each one of the pair of first spacers 121a is substantially coplanar with a top surface of the hard mask layer 10, but slightly lower than the top surface of the hard mask layer 10 at the recess 121r. While the first spacers 121a are merged, an observable interface (illustrated by a dash line) may exist at the interface between them, indicating that they are once two separate layers. In some embodiments, the pair of first spacers 121a fills up the first opening 101, and the pair of first spacers 121a is respectively disposed on the opposite sidewalls of the opening 102, 103 without filling up the opening 102, 103. Thus, a portion of the second dielectric layer 113B underlying the first opening 101 is fully covered by the pair of first spacers 121a, and a portion of the second dielectric layer 113B underlying the opening 102, 103 is exposed by the pair of first spacers 121a. In some embodiments, a landing width w' of the first spacers 121a is substantially equal to the width w of the first spacer layer 121.

Referring to FIG. 2E, portions of the second dielectric layer 113B are removed, to expose the second electrode layer 112B directly underlying the second dielectric layer 113B. In some embodiments, the pair of first spacers 121a in the second opening 102 and the third opening 103 may be used as a mask to remove the portions of a second dielectric layer 113B, such that the second opening 102 and the third opening 103 may be extended. In some embodiments, a second etching process is performed to remove the portions of the second dielectric layer 113B and thus expose the second electrode layer 112B. In some embodiments, an etchant of the second etching process is different from the etchant of the first etching process. For example, the etchant of the second etching process is $BCl_3$, Ar, or the like.

Referring to FIG. 2F, portions of the second electrode layer 112B are removed, to expose the third dielectric layer 113C directly underlying the second electrode layer 112B. In some embodiments, the pair of first spacers 121a in the second opening 102 and the third opening 103 may be used as a mask to remove the portions of the second electrode layer 112B, such that the second opening 102 and the third opening 103 may be further extended. That is, the second dielectric layer 113B and the second electrode layer 112B therebeneath may be patterned by a self-aligned process without additional mask. In some embodiments, a third etching process is performed to remove the portions of a second electrode layer 112B and thus expose the third dielectric layer 113C. In some embodiments, an etchant of the third etching process is different from the etchant of the first etching process. For example, the etchant of the third etching process may be $BCl_3$, $Cl_2$, or the like.

After filling up the first opening 101 with the pair of first spacers 121a, a pair of second spacers 122a is respectively formed in the second opening 102 and the third opening 103, such that the pair of first spacers 121a and the pair of second spacers 122a together fill up the second opening 102 without filling up the third opening 103. FIG. 2G and FIG. 2H illustrate the forming method of the pair of second spacers 122a, which may be similar to that of the pair of first spacers 121a.

Referring to FIG. 2G, a second spacer layer 122 (e.g., SiN, $SiO_2$, or the like) may be formed to fill up the second opening 102 and partially fill the third opening 103. In some embodiments, a deposition process is performed to deposit the second spacer layer 122 conformally over the first spacers 121a and the openings 102, 103, such that the second spacer layer 122 formed on opposite sidewalls of the second opening 102 merge together. In other words, the second spacer layer 122 may fill up the second opening 102. In some embodiments, for the purpose of merge, a width of the second spacer layer 122 is substantially equal to the width of the first spacer layer 121 and larger than or equal to one quarter of the width of the second opening 102.

Referring to FIG. 2H, by removing portions of the second spacer layer 122, pairs of second spacers 122a are respectively formed in the second opening 102 and the third opening 103. For example, portions of the second spacer layer 122 outside the first opening 101, the second opening 102, and third opening 103 and a portion of the second spacer layer 122 on the bottom surface of the third opening 103 are removed, to form the pair of second spacers 122a in the second opening 102 and the third opening 103. The pair of second spacers 122a is disposed between and in direct contact with the pair of first spacers 121a, for example. While the second spacer 122a is merged with the first spacer 121a, an observable interface (illustrated by a solid line) may exist at the interface between them, indicating that they are once two separate layers. Similarly, while the second spacers 122a are merged in the second opening 102, an observable interface (illustrated by a dash line) may exist at the interface between them, indicating that they are once two separate layers. The pair of second spacers 122a may be formed by the first etching process mentioned above (using $SF_6$, $CF_4$, $CHF_3$, $CH_2F_2$, $C_4F_6$ or the like as an etchant).

In some embodiments, as shown in FIG. 2H, a recess 122r is formed at where the second spacers 122a contact. The recess 122r may be at a top surface of the pair of second spacers 122a and recessed towards the center of the second opening 102 in the vertical direction. In such embodiments, a top surface of each one of the pair of second spacers 122a is substantially coplanar with a top surface of the hard mask layer 10, but slightly lower than the top surface of the hard mask layer 10 at the recess 122r.

In some embodiments, the pair of first spacers 121a and the pair of second spacers 122a fill up the second opening 102, and the pair of second spacers 122a is disposed on the opposite sidewalls of the opening 103 without filling up the opening 103. Thus, a portion of the third dielectric layer 113C underlying the second opening 102 is fully covered by the pair of first spacers 121a and the pair of second spacers 122a while a portion of the third dielectric layer 113C underlying the third opening 103 is exposed by the pair of second spacers 122a (not shown). In some embodiments, a width of the second spacer 122a is substantially equal to the width of the second spacer layer 122.

Then, the exposed third dielectric layer 113C may be removed by using the pair of first spacers 121a and the pair of second spacers 122a in the third opening 103 as a mask, to expose the third electrode layer 112C directly underlying the third dielectric layer 113C. Similarly, the exposed third electrode layer 112C may be removed by using the pair of first spacers 121a and the pair of second spacers 122a in the third opening 103 as a mask, to expose the fourth dielectric layer 113D directly underlying the third electrode layer 112C as shown in FIG. 2H. That is, the third dielectric layer 113C and the third electrode layer 112C therebeneath may be patterned by a self-aligned process without additional mask. The removal methods of the dielectric layer 113C and the electrode layer 112C may be similar to those described above and thus omitted herein.

In some embodiments, as shown in FIG. 2H, the pair of first spacers 121a is directly formed on the second dielectric layer 113B and the pair of second spacers 122a is directly formed on the third dielectric layer 113C directly below the second electrode layer 113B.

Referring to FIG. 2I, after the first opening 101 and the second opening 102 are sequentially filled, a pair of third spacers 123a is formed to fill up the remained opening (e.g., the third opening 103). The forming method of the pair of third spacers 123a is similar to that of the pair of second spacers 122a and thus omitted herein. In some embodiments, a width of the third spacer 123a is substantially equal to the width of the first spacer 121a and the width of the second spacer 122a, and larger than or equal to one-sixth of the width 103w of the third opening 103. In some embodiments, a recess 123r is formed at where the third spacers 123a contact. The recess 123r may be at a top surface of the pair of third spacers 123a and recessed towards the center of the third opening 103 in the vertical direction. In such embodiments, a top surface of each one of the pair of third spacers 123a is substantially coplanar with a top surface of the hard mask layer 10, but slightly lower than the top surface of the hard mask layer 10 at the recess 123r.

As mentioned above, the fifth area A5 undergoes the same processes described in FIG. 2B to FIG. 2I. Thus, as shown in FIG. 2J, the pair of first spacers 121a, the pair of second spacers 122a, and the pair of third spacers 123a are formed in a fourth opening 104 of the fifth area A5. In some embodiments, the fourth opening 104 is large than the third opening 103 and thus is not filled by the pair of first spacers 121a, the pair of second spacers 122a, and the pair of third spacers 123a.

Referring to FIG. 2J, after formation of the pair of third spacers 123a, the fourth dielectric layer 113D and the fourth electrode layer 112D may be removed by using the pairs of first to third spacers 121a, 122a, and 123a in the fourth opening 104 as a mask, so as to expose the dielectric liner 111. That is, the fourth dielectric layer 113D and the fourth electrode layer 112D therebeneath may be patterned by a self-aligned process without additional mask.

Then, an isolation layer 130 may be formed over the substrate 110, to cover the pairs of first to third spacers 121a, 122a, and 123a and fill up the fourth opening 104. In some embodiments, the hard mask layer 10 is remained, and the isolation layer 130 covers and is in direct contact with the hard mask layer 10. In alternative embodiments (not shown), the hard mask layer 10 is removed before forming the isolation layer 130, and the isolation layer 130 is in direct contact with outer sidewalls of the pairs of first spacers 121a.

Figure 3:
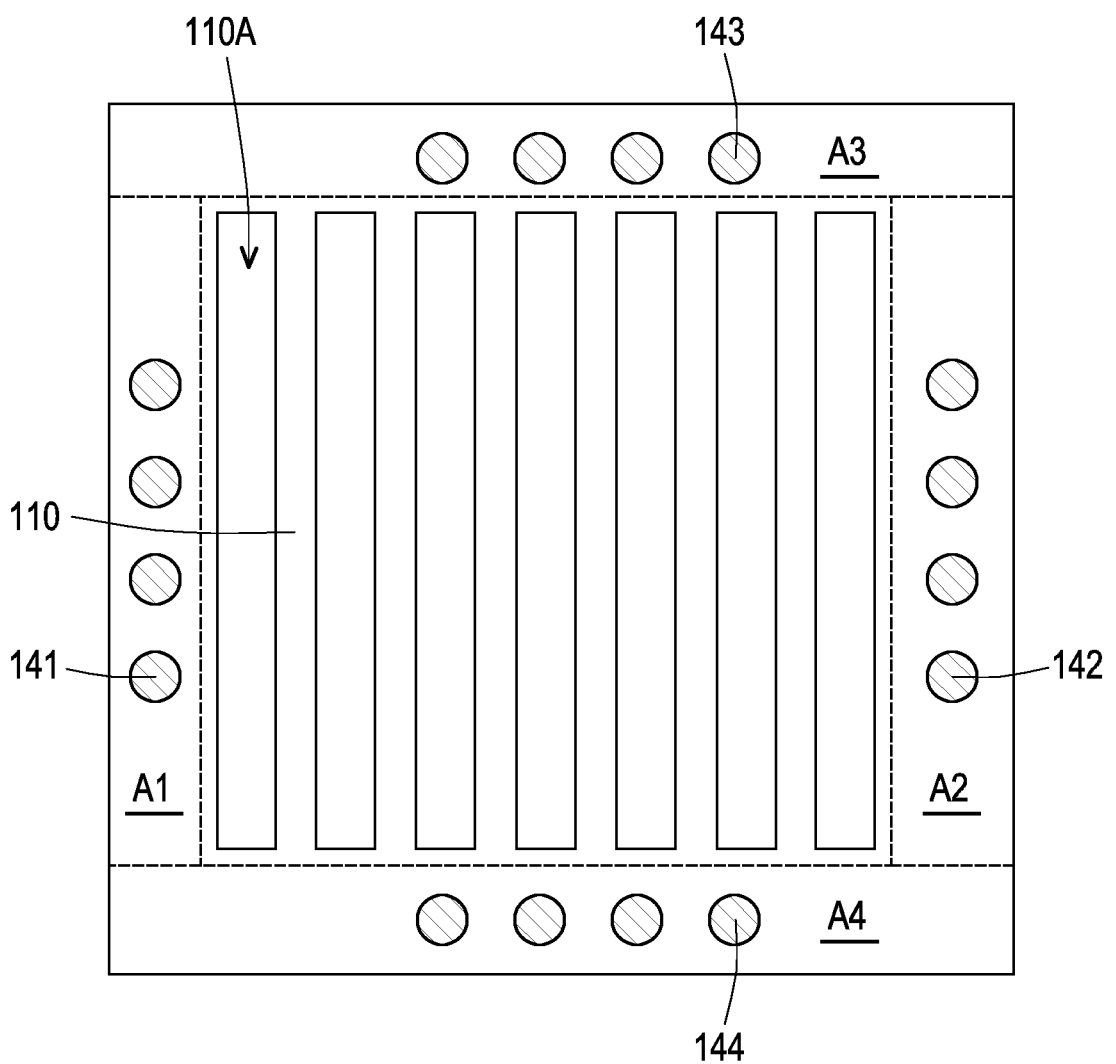
FIG. 3 illustrates a top view of a semiconductor device according to some embodiments.

After that, as shown in FIG. 2J and FIG. 3, a plurality of contact vias 141 to 144 are formed in the first to fourth areas A1 to A4, to electrically connect the first to fourth electrode layers 112A, 112B, 112C, 112D respectively. In some embodiments, a contact via hole for the contact via 141 is formed by removing portions of the isolation layer 130, the hard mask layer 10, the dielectric layer 114, the first dielectric layer 113A and the first electrode layer 112A. A contact via hole for the contact via 142 may be formed by removing portions of the isolation layer 130, the pair of first spacers 121a, the second dielectric layer 113B and the second electrode layer 112B. Similarly, a contact via hole for the contact via 143 may be formed by removing portions of the isolation layer 130, the pair of second spacers 122a, the third dielectric layer 113C and the third electrode layer 112C. A contact via hole for the contact via 144 may be formed by removing portions of the isolation layer 130, the pair of third spacers 123a, the fourth dielectric layer 113D and the fourth electrode layer 112D. Then, the contact vias 141 to 144 are formed in the contact holes respectively. In some embodiments, the contact holes may be formed simultaneously, and the contact vias 141 to 144 may be formed simultaneously. In some embodiments, the contact vias 141 to 144 penetrate the electrode layers 112A to 112D respectively. However, the disclosure is not limited thereto. In alternative embodiments, the contact vias 141 to 144 stop at top surfaces of the electrode layers 112A to 112D without penetrating. In such embodiments, bottom surfaces of the contact vias 141 to 144 are substantially coplanar with the top surfaces of the electrode layers 112A to 112D and the bottom surfaces of the dielectric layers 113A to 113D, respectively.

As shown in FIG. 2J, the electrode layers (112A, 112B, 112C, 112D) and the dielectric layers (113A, 113B, 113C, 113D) form a plurality of mirror staircase portions (101A, 102A, 103A, 104A) over the substrate 110 and a plurality of deep trench portions in the deep trenches 110A of the substrate 110. In some embodiments, the mirror staircase portions (101A, 102A, 103A, 104A) are formed by using the pairs of spacers 121a to 123c as masks, and thus only one hard mask layer 10 for forming the openings 101 to 104 is required. Accordingly, the manufacturing process for forming the mirror staircase portions is simplified and the cost is reduced.

In some embodiments, the contact vias 142 is electrically connected to the bottommost electrode layer 112B of the first mirror staircase portion 101A, and the contact via 142 is surrounded by the spacer structure including the pair of first spacers 121a. Similarly, the contact via 143 is electrically connected to the bottommost electrode layer 112C of the second mirror staircase portion 102A, and the contact vias 143 is surrounded by the spacer structure including the pairs of first and second spacers 121a, 122a. The contact vias 144 is electrically connected to the bottommost electrode layer 112D of the third mirror staircase portion 103A, and the contact vias 144 is surrounded by the spacer structure including the pairs of first to third spacers 121a, 122a, 123a, for example. The spacer structure is further surrounded by the hard mask layer 10 and the dielectric layer 114, and the contact via 141 to 144 is further surrounded by the isolation layer 130, for example. A top surface of the isolation layer 130 is substantially coplanar with a top surface of the contact via 141 to 144.

Referring to FIG. 2J, the mirror staircase portion 102A includes a first staircase 102A1 and a second staircase 102A2 facing the first staircase 102A1. In each of the first staircase 102A1 and the second staircase 102A2, two horizontal steps S2 are disposed on the bottommost horizontal step S1, for example. The bottommost horizontal step S1 is continuously from the first staircase 102A1 and the second staircase 102A2. In other words, the bottommost horizontal step S1 serves as the bottommost horizontal step of both first and second staircase 102A1, 102A2. The bottommost horizontal step S1 in the mirror staircase portion 102A is the third electrode layer 112C, for example. The horizontal step S2 may include the electrode layer 112A to 112C and the respective dielectric layer 113A to 113C disposed thereon and directly contacting thereto. Sidewalls of the electrode layer 112A to 112C and the respective dielectric layer 113A to 113C of each horizontal step S2 are substantially flush, for example. The contact via 143 is in direct contact with a sidewall of the third dielectric layer 113C and a sidewall and a top surface of the third electrode layer 112C, for example.

Similarly, the mirror staircase portion 103A includes a first staircase 103A1 and a second staircase 103A2 facing the first staircase 103A1. In each of the first staircase 103A1 and the second staircase 103A2, three horizontal step S2 are disposed on the bottommost horizontal step S1, for example. The bottommost horizontal step S1 is continuously from the first staircase 103A1 and the second staircase 103A2. In other words, the bottommost horizontal step S1 serves as the bottommost horizontal step of both first and second staircase 103A1, 103A2. The bottommost horizontal step S1 in the mirror staircase portion 103A is the fourth electrode layer 112D, for example. The horizontal step S2 may include the electrode layer 112A to 112D and the respective dielectric layer 113A to 113D disposed thereon and directly contacting thereto. Sidewalls of the electrode layer 112A to 112D and the respective dielectric layer 113A to 113D of each horizontal step S2 are substantially flush, for example. The contact via 144 is in direct contact with a sidewall of the third dielectric layer 113D and a sidewall and a top surface of the third electrode layer 112D, for example. It is noted that although the mirror staircase portion has the structure as illustrated in FIG. 2J, the mirror staircase portion may have any suitable configurations.

Referring to FIG. 2K, additional metal interconnect structures 150 and additional dielectric material layers 151 may be formed over the contact vias (141, 142, 143, 144). The additional dielectric material layers 151 may include at least one line-level dielectric material layer and the additional metal interconnect structures 150 may include metal line structures that are electrically connected to the electrode layers (112A, 112B, 112C, 112D). Subsequently, the exemplary structure may be diced into a plurality of semiconductor dies 100 and each semiconductor die 100 may include a deep trench capacitor structure.

Figure 2L:
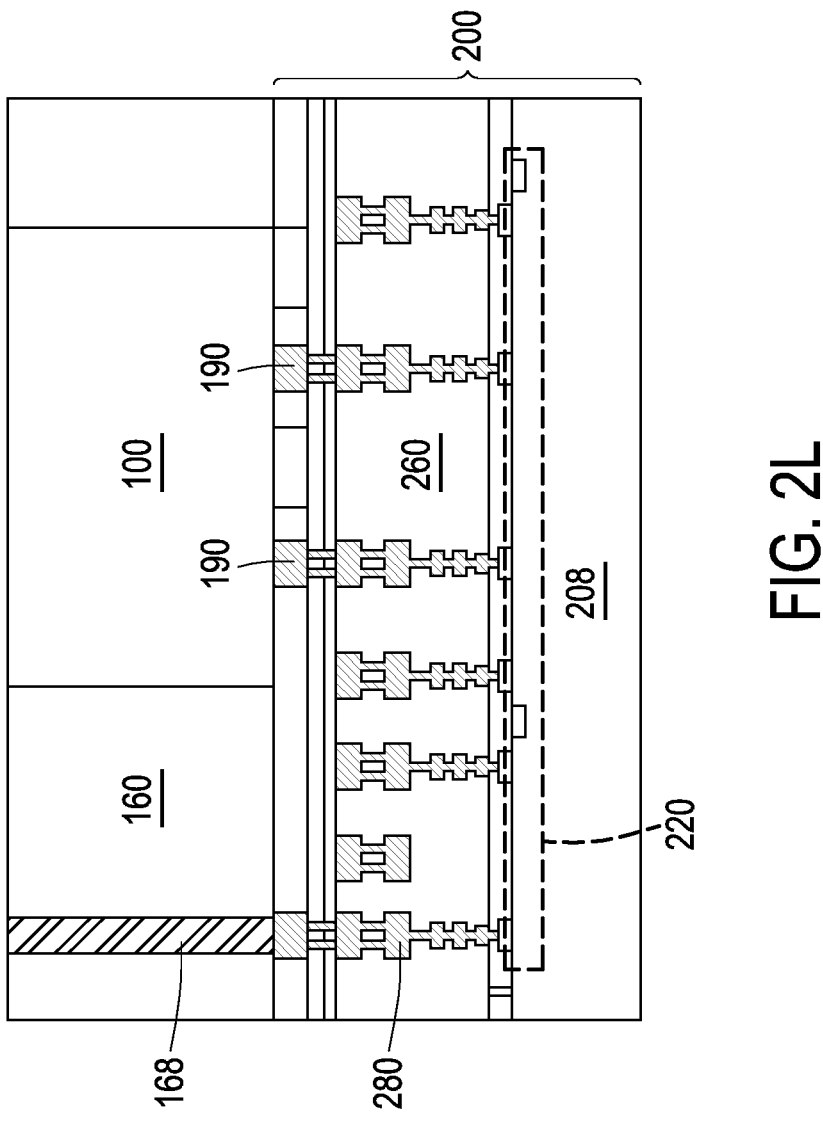

Referring to FIG. 2L, the semiconductor die 100 including the deep trench capacitor structure may be attached to a semiconductor die 200 including semiconductor device 220 therein. In some embodiments, the semiconductor die 200 may be formed on a semiconductor wafer. The semiconductor die 200 may include a portion of a semiconductor substrate 208, which may be a single crystalline silicon substrate such as a single crystalline silicon substrate. The semiconductor device 220 may include field effect transistors using a portion of the semiconductor substrate 208 or an epitaxially semiconductor material portion aligned to the single crystalline semiconductor material of the semiconductor substrate 208 as a channel region. The field effect transistors may be planar field effect transistors, fin field effect transistors, or gate-all-around (GAA) field effect transistors. The semiconductor die 200 may include metal interconnect structures 280 embedded in dielectric material layers 260.

In some embodiments, the semiconductor die 100 is electrically connected to the semiconductor devices 220 through a metallic connection structure 190. In some embodiments, a dielectric layer 160 is formed over the semiconductor die 200 around the semiconductor die 100. The dielectric layer 160 may include a polymer molding compound. Excess portions of the dielectric layer 160 may be removed from above the horizontal plane. At least one through-dielectric via structure 168 may be formed through the dielectric layer 160 on a respective one of the metal interconnect structures 280 within the semiconductor die 200.

Figure 2M:
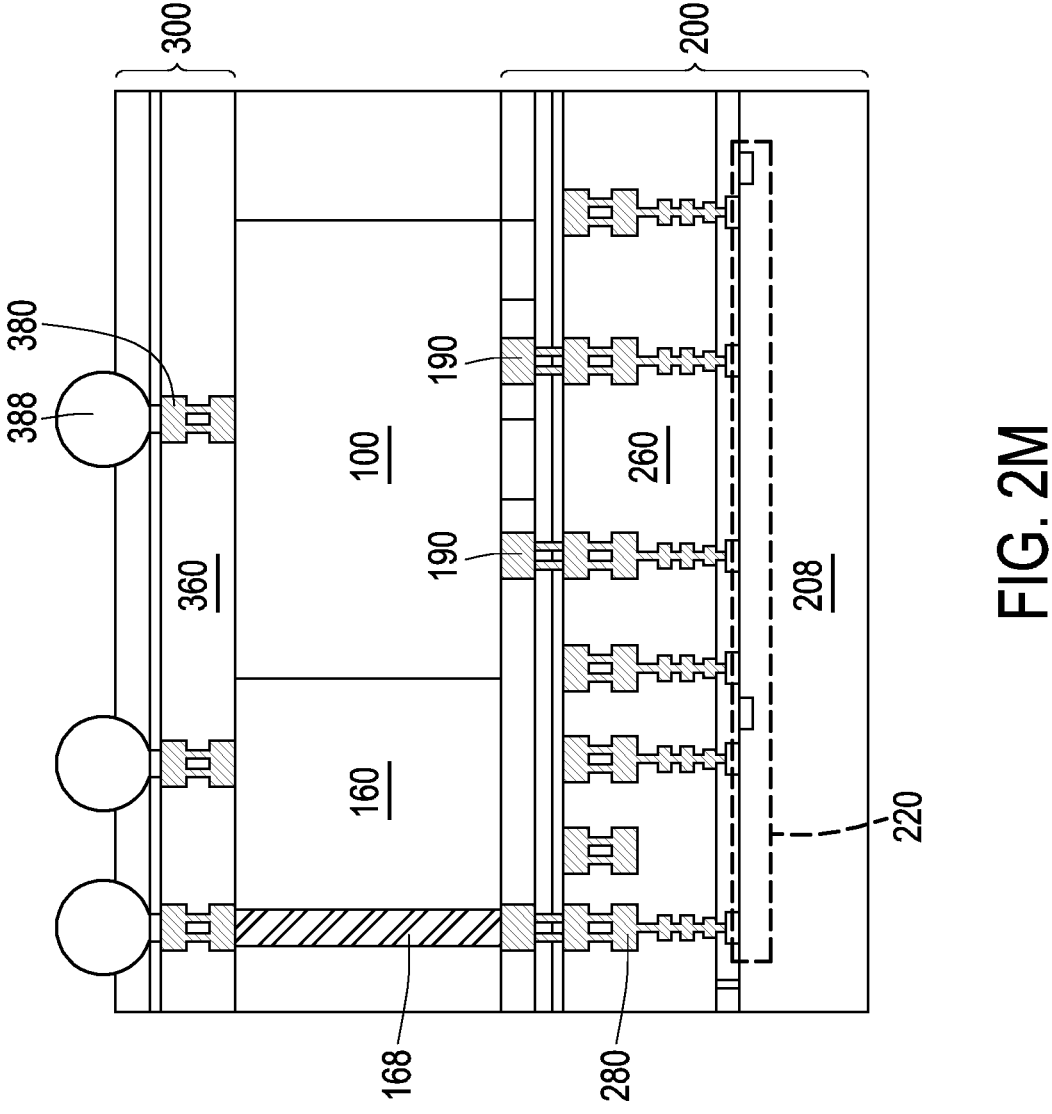

Referring to FIG. 2M, a redistribution interconnect assembly 300 is formed over the capacitor die 100 and the dielectric layer 160. The redistribution interconnect assembly 300 may include redistribution metal interconnect structures 380 embedded in redistribution dielectric material layers 360.

In some embodiments, the deep trench capacitor structure includes N number of electrode layers and N number of dielectric layers alternately stacked over the substrate 110, and N is a positive integer and larger than 2. The N number of electrode layers 112 and the N number of dielectric layers 113 form N number of mirror staircase portions. For example, in the embodiments of FIG. 2J, N is 4, and 4 mirror staircase portions 101A-104A are formed. (N−1) number of contact via are formed to electrically connect to (N−1) number of mirror staircase portions respectively, wherein the (N−1)th contact via is electrically connected to the Nth electrode layer of the (N−1)th mirror staircase portion, the (N−1)th contact via is surrounded by (N−1) number of pairs of spacers. For example, in the embodiments of FIG. 2J, three (3) contact vias 142-144 are formed to electrically connect to three (3) mirror staircase portions 101A-103A respectively. The third contact via 144 is electrically connected to the fourth electrode layer 112D of the third mirror staircase portion 103A, and the third contact via 144 is surrounded by three (3) of pairs of spacers 121a, 122a, 123a. Similarly, the second contact via 143 is electrically connected to the third electrode layer 112C of the second mirror staircase portion 102A, and the second contact via 143 is surrounded by two (2) of pairs of spacers 121a, 122a. The first contact via 142 is electrically connected to the second electrode layer 112B of the first mirror staircase portion 101A, and the first contact via 142 is surrounded by one (1) pair of spacers 121a.

During the formation of the (N−1) number of pairs of spacers, a hard mask layer having N number of openings is provided, and then (N−1) number of deposition processes and (N−1) number of etching processes are performed. For example, in the processes of FIG. 2B to 2I, three (3) pairs of spacers 121a, 122a, 123a are formed, a hard mask layer 10 having four (4) openings 101-104 is provided, and then three (3) deposition processes and three (3) etching processes of three (3) spacer layers 121, 122, 123 are performed. A width of the (N−1)th opening is larger than the width of (N−2)th opening. For example, the width of the third opening 103 is larger than the width of the second opening 102, and the width of the second opening 102 is larger than the width of the first opening 101. A width of the spacer is not smaller than ½ of the smallest opening, for example. In some embodiments, the width of the (N−1)th opening is 2(N−1) times of a width of a spacer when each spacer 121a, 122a, 123a has the same width. For example, the width of the first opening 101 is twice width of the spacer 121a, the width of the second opening 102 is fourth width of spacer 121a, and the width of the third opening 103 is sixth width of the spacer 121a.

Figure 4:
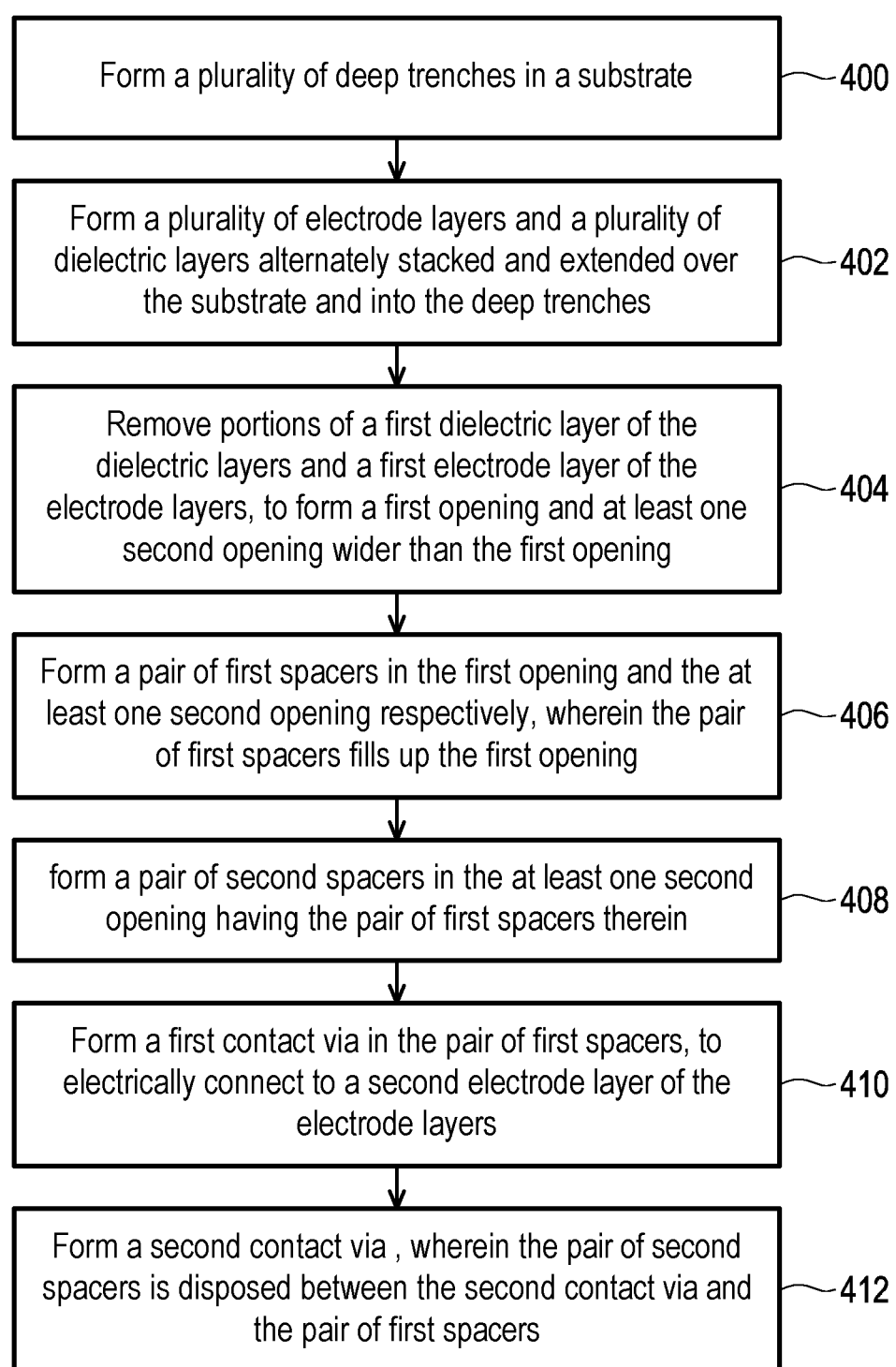
FIG. 4 illustrates a flow chart of a method of forming a semiconductor device according to some embodiments.

FIG. 4 illustrates a flow chart of a method of forming a semiconductor device according to some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 400, a plurality of deep trenches are formed in a substrate. FIG. 1 and FIG. 2A illustrate top and cross-sectional views corresponding to some embodiments of act 400.

At act 402, a plurality of electrode layers and a plurality of dielectric layers are alternately stacked and extended over the substrate and into the deep trenches. FIG. 2A illustrates a cross-sectional view corresponding to some embodiments of act 402.

At act 404, portions of a first dielectric layer of the dielectric layers and a first electrode layer of the electrode layers are removed, to form a first opening and at least one second opening wider than the first opening. FIG. 2B illustrates a cross-sectional view corresponding to some embodiments of act 404.

At act 406, a pair of first spacers is formed in the first opening and the at least one second opening respectively, wherein the pair of first spacers fills up the first opening. FIG. 2C and FIG. 2D illustrate a cross-sectional view corresponding to some embodiments of act 406.

At act 408, a pair of second spacers is formed in the at least one second opening having the pair of first spacers therein. FIG. 2H and FIG. 2I illustrate cross-sectional views corresponding to some embodiments of act 408.

At act 410, a first contact via is formed in the pair of first spacers, to electrically connect to a second electrode layer of the electrode layers. FIG. 2J illustrates a cross-sectional view corresponding to some embodiments of act 410.

At act 412, a second contact via is formed, wherein the pair of second spacers is disposed between the second contact via and the pair of first spacers. FIG. 2J illustrates a cross-sectional view corresponding to some embodiments of act 412.

In accordance with some embodiments of the disclosure, a semiconductor device includes a substrate and a deep trench capacitor structure. The deep trench capacitor structure includes a plurality of electrode layers and a plurality of dielectric layers alternately stacked, a contact via and at least one pair of spacers. The electrode layers and the dielectric layers form a mirror staircase portion over the substrate and a deep trench portion in the substrate. The contact via is electrically connected to a bottommost one of the electrode layers in the mirror staircase portion. The at least one pair of spacers is disposed on the mirror staircase portion and surrounds the contact via.

In accordance with some embodiments of the disclosure, a semiconductor device includes a deep trench capacitor structure. The deep trench capacitor structure includes N number of electrode layers and N number of dielectric layers alternately stacked and first to (N−1)th contact vias. The electrode layers and the dielectric layers form N number of mirror staircase portions, Nth electrode layer is the bottommost one of the electrode layers, Nth dielectric layer is the bottommost one of the dielectric layers, and N is a positive integer and larger than 2. The first to (N−1)th contact vias are electrically connected to first to the (N−1)th mirror staircase portions respectively, wherein the (N−1)th contact via is electrically connected to the Nth electrode layer of the (N−1)th mirror staircase portion, and the (N−1)th contact via is surrounded by (N−1) number of pairs of spacers.

In accordance with some embodiments of the disclosure, a method of forming a semiconductor device is as follows.

A plurality of deep trenches are formed in a substrate. A plurality of electrode layers and a plurality of dielectric layers are alternately stacked and extended over the substrate and into the deep trenches. Portions of a first dielectric layer of the dielectric layers and a first electrode layer of the electrode layers are removed, to form a first opening and at least one second opening wider than the first opening. A pair of first spacers is formed in the first opening and the at least one second opening respectively, wherein the pair of first spacers fills up the first opening. A pair of second spacers is formed in the at least one second opening having the pair of first spacers therein. A first contact via is formed in the pair of first spacers, to electrically connect to a second electrode layer of the electrode layers. A second contact via is formed, wherein the pair of second spacers is disposed between the second contact via and the pair of first spacers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a deep trench capacitor structure, comprising:
      a plurality of electrode layers and a plurality of dielectric layers alternately stacked, wherein the electrode layers and the dielectric layers form a mirror staircase portion over the substrate and a deep trench portion in the substrate; and
      a contact via, electrically connected to a bottommost one of the electrode layers in the mirror staircase portion; and
      at least one pair of spacers, disposed on the mirror staircase portion and surrounding the contact via.

2. The semiconductor device of claim 1, wherein the at least one pair of spacers is in direct contact with the contact via.

3. The semiconductor device of claim 1, wherein the at least one pair of spacers is disposed on and in direct contact with one of the dielectric layers.

4. The semiconductor device of claim 1, wherein the at least one pair of spacers is in direct contact with sidewalls of one of the dielectric layers and one of the electrode layers directly contacting the one of the dielectric layers.

5. The semiconductor device of claim 1, wherein the at least one pair of spacers comprises a pair of first spacers and a pair of second spacers, and the pair of second spacers is disposed between the contact via and the pair of first spacers.

6. The semiconductor device of claim 1, further comprising a hard mask layer aside the at least one pair of spacers, wherein a top surface of the hard mask layer is substantially coplanar with of a top surface of the at least one pair of spacers.

7. The semiconductor device of claim 1, further comprising an isolation layer over the at least one pair of spacers and surrounding the contact via.

8. The semiconductor device of claim 7, wherein a top surface of the isolation layer is substantially coplanar with a top surface of the contact via.

9. The semiconductor device of claim 1, wherein the mirror staircase portion comprises a first staircase and a second staircase facing the first staircase, and each of the first staircase and the second staircase comprises a bottommost horizontal step and at least one horizontal step on the bottommost horizontal step.

10. The semiconductor device of claim 9, wherein the bottommost one of the electrode layers in the mirror staircase portion is continuously from the first staircase and the second staircase, and the bottommost one of the electrode layers in the mirror staircase portion serves as the bottommost horizontal step of the first staircase and the second staircase.

11. The semiconductor device of claim 9, wherein each of the bottommost horizontal step and the at least one horizontal step comprises one of the electrode layers and one of the dielectric layers in direct contact with and on the one of the electrode layers.

12. The semiconductor device of claim 11, wherein a sidewall of the one of the electrode layers in the at least one horizontal step is substantially flush with a sidewall of the one of the dielectric layers in the at least one horizontal step.

13. A semiconductor device, comprising:

a deep trench capacitor structure, comprising:

N number of electrode layers and N number of dielectric layers alternately stacked, wherein the electrode layers and the dielectric layers form N number of mirror staircase portions, Nth electrode layer is the bottommost one of the electrode layers, Nth dielectric layer is the bottommost one of the dielectric layers, and N is a positive integer and larger than 2; and first to (N−1)th contact vias, electrically connected to first to (N−1)th mirror staircase portions respectively, wherein the (N−1)th contact via is electrically connected to the Nth electrode layer of the (N−1)th mirror staircase portion, and the (N−1)th contact via is surrounded by (N−1) number of pairs of spacers.

14. The semiconductor device of claim 13, wherein a (N−1)th pair of spacers of the (N−1) number of pairs of spacers is disposed on the Nth dielectric layer of the (N−1)th mirror staircase portion.

15. The semiconductor device of claim 14, wherein the (N−1)th pair of spacers of the (N−1) number of pairs of spacers is in direct contact with the (N−1)th contact via.

16. A method of forming a semiconductor device, comprising:

forming a plurality of deep trenches in a substrate;

forming a plurality of electrode layers and a plurality of dielectric layers alternately stacked and extended over the substrate and into the deep trenches;

removing portions of a first dielectric layer of the dielectric layers and a first electrode layer of the electrode layers, to form a first opening and at least one second opening wider than the first opening;

forming a pair of first spacers in the first opening and the at least one second opening respectively, wherein the pair of first spacers fills up the first opening;

forming a pair of second spacers in the at least one second opening having the pair of first spacers therein;

forming a first contact via in the pair of first spacers, to electrically connect to a second electrode layer of the electrode layers; and forming a second contact via, wherein the pair of second spacers is disposed between the second contact via and the pair of first spacers.

17. The method of claim 16, wherein forming the pair of first spacers comprises:

forming a first spacer layer to fill up the first opening and partially fill the at least one second opening; and removing the first spacer layer outside the first opening and the at least one second opening and the first spacer layer on a bottom surface of the at least one second opening.

18. The method of claim 17, wherein the first spacer layer is conformally formed over the first opening and the second opening.

19. The method of claim 16, further comprising by using the pair of first spacers in the at least one second opening as a mask, removing a second dielectric layer of the dielectric layers and the second electrode layer of the electrode layers, to expose a third dielectric layer of the dielectric layers.

20. The method of claim 19, wherein the second contact via is electrically connected to a third electrode layer of the electrode layers directly below the third dielectric layer of the dielectric layers.

* * * * *